(12) United States Patent  
Pang

(10) Patent No.: US 9,300,285 B2  
(45) Date of Patent: Mar. 29, 2016

(54) GATE DRIVER CIRCUIT

(71) Applicant: SAMSUNG ELECTRO-MECHANICS CO., LTD., Suwon-Si, Gyeonggi-Do (KR)

(72) Inventor: Sung Man Pang, Suwon-Si (KR)

(73) Assignee: SAMSUNG ELECTRO-MECHANICS CO., LTD., Suwon-Si, Gyeonggi-Do (KR)

( * ) Notice: Subject to any disclaimer, the term of this patent is extended or adjusted under 35 U.S.C. 154(b) by 38 days.

(21) Appl. No.: 14/198,255

(22) Filed: Mar. 5, 2014

(65) Prior Publication Data

US 2015/0171852 A1 Jun. 18, 2015

(30) Foreign Application Priority Data

Dec. 18, 2013 (KR) .......................... 10-2013-0158241

(51) Int. Cl.  
*H01L 29/78* (2006.01)  
*H03K 17/081* (2006.01)  
*H03K 17/16* (2006.01)

(52) U.S. Cl.  
CPC .......... *H03K 17/08104* (2013.01); *H01L 29/78* (2013.01); *H03K 17/163* (2013.01)

(58) Field of Classification Search  
CPC ............ H03K 17/00; H03K 17/08104; H03K 17/163; H01L 29/00; H01L 29/78  
USPC ........................................................ 327/108  
See application file for complete search history.

(56) References Cited

U.S. PATENT DOCUMENTS

| 8,451,045 | B2 | 5/2013 | Yim et al. |
| 8,842,405 | B2 | 9/2014 | Miura et al. |
| 2008/0212247 | A1 | 9/2008 | Lee et al. |
| 2009/0058499 | A1 | 3/2009 | Yamashiro et al. |
| 2012/0025875 | A1* | 2/2012 | Fukuta et al. .................. 327/109 |

FOREIGN PATENT DOCUMENTS

| JP | 2009-55696 A | 3/2009 |
| JP | 2012-070263 A | 4/2012 |
| KR | 10-2008-0045927 A | 5/2008 |
| KR | 10-2012-0029915 A | 3/2012 |

OTHER PUBLICATIONS

Korean Office Action dated Jun. 30, 2015 issued in corresponding Korean Patent Application No. 10-2013-0158241, with English translation.

* cited by examiner

*Primary Examiner* — John Poos  
*Assistant Examiner* — David Mattison  
(74) *Attorney, Agent, or Firm* — McDermott Will & Emery LLP

(57) ABSTRACT

A gate driver circuit may include a driving signal generating unit generating first and second control signals based on a data signal and a fault state signal and controlling gate detection, a driving inverter operating in response to the first and second control signals to generate a gate signal and providing the gate signal to a power switch element, and a soft turn-off/ gate detecting unit operating in response to the second control signal, performing a soft turn-off in the case of a fault, and detecting the gate signal to provide a detected signal.

19 Claims, 5 Drawing Sheets

GATE DRIVER CIRCUIT

CROSS-REFERENCE TO RELATED APPLICATION

This application claims the benefit of Korean Patent Application No. 10-2013-0158241 filed on Dec. 18, 2013, with the Korean Intellectual Property Office, the disclosure of which is incorporated herein by reference.

BACKGROUND

The present disclosure relates to a gate driver circuit.

In general, a gate driver circuit of a power switch element generates and provides an appropriate gate voltage (e.g., 20V) to drive a gate of such a power switch element by using an input signal having a low voltage (e.g., 5V or less).

In addition, when a fault is generated, for example, in the case that a current flowing in the power switch element becomes an over-current, power in the driver circuit is abnormal, or the like, the power switch element needs to be turned off by blocking a gate driving signal.

In this case, the power switch element needs to be softly turned off, for example, slowly turned off. This is so as not to damage the power switch element or peripheral circuits when such a fault is generated.

In addition, in the case that a power switch element such as an insulated gate bipolar transistor (IGBT), a metal-oxide semiconductor field-effect-transistor (MOSFET), or the like is turned off, a malfunction may occur, in which the power switch element is turned on again, because of an increase in a gate voltage due to Miller capacitance between a collector and a base (parasitic capacitance formed between a collector and a gate) when a collector voltage is sharply increased. In order to prevent such a malfunction, a clamp circuit is required.

Typically, in a switch circuit configured of a high side power switch element and a low side power switch element, in order to drive the low side power switch element, a semiconductor element used in an integrated circuit needs to have a breakdown voltage of 20V or more.

In this case, as a semiconductor process technology is developed, a line width of a level of 0.35 µm or less may be used even in a process for a semiconductor element having a breakdown voltage of 20V or more, but in the case that such a semiconductor element has a large breakdown voltage, an area thereof may be increased.

Characteristics of this process may be that a logic circuit portion may be designed and manufactured by using a low voltage (5V or less) element, and a circuit driving a power element may be designed and manufactured by using a medium voltage (20V level or more) element. When the integrated circuit is implemented, since an area of the low voltage element is significantly smaller than that of such a medium voltage element, the logic circuit implemented using such a low voltage element alone may allow an area of the integrated circuit to be very small, as compared to the logic circuit and the driver circuit implemented using only the medium element. Therefore, there is a need for research into and development of a logic circuit using such a low voltage element.

A gate driver circuit of a power switch element according to the related art includes a gate driver circuit for driving a gate voltage of the IGBT and a logic circuit for detecting a voltage of a gate driving signal. In general, since such a logic circuit directly receives a gate driving signal, such a logic circuit may be destroyed.

For example, in the case in which a gate voltage is received through an inverter to allow the gate voltage of the IGBT element to be sensed, since the gate voltage may be generally increased up to 20V, the inverter may be destroyed in the case in which the element having an input gate breakdown voltage smaller than 20V is used.

Therefore, in a gate driver circuit capable of performing a soft turn-off operation or a gate clamp operation, performed when a fault is generated, in order to use the logic circuit to detect the gate signal, there is a need for research into and development of a gate driver circuit capable of detecting a high gate voltage.

SUMMARY

An aspect of the present disclosure may provide a gate driver circuit capable of performing a soft turn-off operation by generating a driving signal and stably detecting a high gate signal, based on a fault state.

According to an aspect of the present disclosure, a gate driver circuit may include: a driving signal generating unit configured to generate first and second control signals based on a data signal and a fault state signal and control gate detection; a driving inverter configured to operate in response to the first and second control signals to generate a gate signal and provide the gate signal to a power switch element; and a soft turn-off/gate detecting unit configured to operate in response to the second control signal, perform a soft turn-off in the case of a fault, and detect the gate signal to provide a detected signal.

The driving signal generating unit may generate the first control signal using the data signal and the fault state signal and generate the second control signal using the first control signal and the fault state signal.

The driving signal generating unit may include: a first inverter inverting the data signal; a second inverter inverting the fault state signal; an AND gate performing an AND operation on an output signal of the first inverter and an output signal of the second inverter to provide the first control signal; a first buffer providing the first control signal to the driving inverter; an OR gate performing an OR operation on the first control signal and the fault state signal to provide the second control signal; and a second buffer providing the second control signal to the soft turn-off/gate detecting unit.

The driving inverter may include: a level shifter shifting a level of the second control signal; a PMOS transistor having a source connected to an operating voltage terminal, a gate connected to an output terminal of the level shifter, and a drain; and an NMOS transistor having a drain connected to the drain of the PMOS transistor, a gate receiving the first control signal, and a source connected to a ground, wherein the gate signal is provided from a connection node between the PMOS transistor and the NMOS transistor via a resistor.

The soft turn-off/gate detecting unit may include: an NMOS transistor having a drain connected to a gate of the power switch element, a gate receiving the second control signal, and a source; and a detecting resistor connected between the source of the NMOS transistor and a ground and proportionally detecting a gate voltage of the power switch element to provide the detected signal.

According to another aspect of the present disclosure, a gate driver circuit may include: a driving signal generating unit configured to generate first and second control signals based on a data signal and a fault state signal and control gate detection; a driving inverter configured to operate in response to the first and second control signals to generate a gate signal and provide the gate signal to a power switch element; a soft turn-off/gate detecting unit configured to operate in response to the second control signal, perform a soft turn-off in the case of a fault, and detect the gate signal to provide a detected signal; a clamp controlling unit configured to provide a gate clamp control signal based on the second control signal and the detected signal; and an active clamp circuit unit configured to operate in response to the clamp control signal of the clamp controlling unit to connect a gate of the power switch element to a ground.

The driving signal generating unit may generate the first control signal using the data signal and the fault state signal and generate the second control signal using the first control signal and the fault state signal.

The driving signal generating unit may include: a first inverter inverting the data signal; a second inverter inverting the fault state signal; an AND gate performing an AND operation on an output signal of the first inverter and an output signal of the second inverter to provide the first control signal; a first buffer providing the first control signal to the driving inverter; an OR gate performing an OR operation on the first control signal and the fault state signal to provide the second control signal; and a second buffer providing the second control signal to the soft turn-off/gate detecting unit.

The driving inverter may include: a level shifter shifting a level of the second control signal; a PMOS transistor having a source connected to an operating voltage terminal, a gate connected to an output terminal of the level shifter, and a drain; and an NMOS transistor having a drain connected to the drain of the PMOS transistor, a gate receiving the first control signal, and a source connected to a ground, wherein the gate signal is provided from a connection node between the PMOS transistor and the NMOS transistor via a resistor.

The soft turn-off/gate detecting unit may include: an NMOS transistor having a drain connected to a gate of the power switch element, a gate receiving the second control signal, and a source; and a detecting resistor connected between the source of the NMOS transistor and a ground and proportionally detecting a gate voltage of the power switch element to provide the detected signal.

The clamp controlling unit may include: an inverter inverting the detected signal; an AND gate performing an AND operation on the second control signal and an output signal of the inverter; and a buffer providing an output signal of the AND gate to the active clamp circuit unit as the clamp control signal.

The active clamp circuit unit may include an NMOS transistor having a drain connected to the gate of the power switch element, a gate receiving the clamp control signal, and a source connected to the ground.

According to another aspect of the present disclosure, a gate driver circuit may include: a driving signal generating unit configured to generate first and second control signals based on a data signal and a fault state signal and control gate detection; a driving inverter configured to operate in response to the first and second control signals to generate a gate signal and provide the gate signal to a power switch element; a soft turn-off/gate detecting unit configured to operate in response to the second control signal, perform a soft turn-off in the case of a fault, and detect the gate signal to provide a detected signal; a clamp controlling unit configured to provide a gate clamp control signal based on the second control signal and the detected signal; and an active clamp circuit unit configured to operate in response to the clamp control signal of the clamp controlling unit to connect a gate of the power switch element to a ground, wherein the driving signal generating unit and the clamp controlling unit are implemented as a logical circuit.

The driving signal generating unit may generate the first control signal using the data signal and the fault state signal and generate the second control signal using the first control signal and the fault state signal.

The driving signal generating unit may include: a first inverter inverting the data signal; a second inverter inverting the fault state signal; an AND gate performing an AND operation on an output signal of the first inverter and an output signal of the second inverter to provide the first control signal; a first buffer providing the first control signal to the driving inverter; an OR gate performing an OR operation on the first control signal and the fault state signal to provide the second control signal; and a second buffer providing the second control signal to the soft turn-off/gate detecting unit.

The driving inverter may include: a level shifter shifting a level of the second control signal; a PMOS transistor having a source connected to an operating voltage terminal, a gate connected to an output terminal of the level shifter, and a drain; and an NMOS transistor having a drain connected to the drain of the PMOS transistor, a gate receiving the first control signal, and a source connected to a ground, wherein the gate signal is provided from a connection node between the PMOS transistor and the NMOS transistor via a resistor.

The soft turn-off/gate detecting unit may include: an NMOS transistor having a drain connected to a gate of the power switch element, a gate receiving the second control signal, and a source; and a detecting resistor connected between the source of the NMOS transistor and a ground and proportionally detecting a gate voltage of the power switch element to provide the detected signal.

The clamp controlling unit may include: an inverter inverting the detected signal; an AND gate performing an AND operation on the second control signal and an output signal of the inverter; and a buffer providing an output signal of the AND gate to the active clamp circuit unit as the clamp control signal.

The active clamp circuit unit may include an NMOS transistor having a drain connected to the gate of the power switch element, a gate receiving the clamp control signal, and a source connected to the ground.

BRIEF DESCRIPTION OF THE DRAWINGS

The above and other aspects, features and other advantages of the present disclosure will be more clearly understood from the following detailed description taken in conjunction with the accompanying drawings, in which.

DETAILED DESCRIPTION

Figure 1:
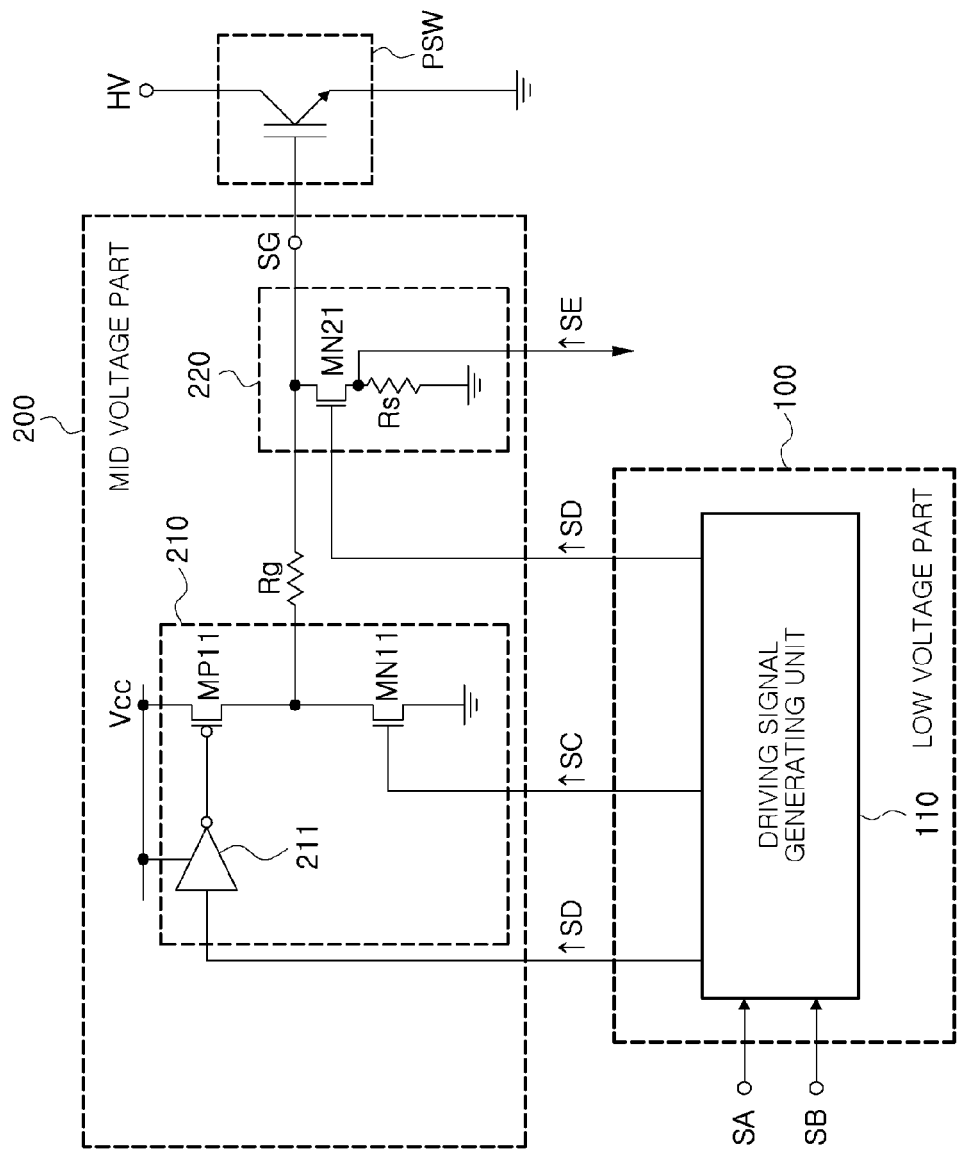
FIG. 1 is a diagram illustrating a first implementation of a gate driver circuit according to an exemplary embodiment of the present disclosure.

Hereinafter, embodiments of the present disclosure will be described in detail with reference to the accompanying drawings. The disclosure may, however, be embodied in many different forms and should not be construed as being limited to the embodiments set forth herein. Rather, these embodiments are provided so that this disclosure will be thorough and complete, and will fully convey the scope of the disclosure to those skilled in the art. Throughout the drawings, the same or like reference numerals will be used to designate the same or like elements.

FIG. 1 is a diagram illustrating a first implementation of a gate driver circuit according to an exemplary embodiment of the present disclosure. Referring to FIG. 1, the gate driver circuit according to an exemplary embodiment of the present disclosure may include a driving signal generating unit 110, a driving inverter 210, and a soft turn-off/gate detecting unit 220.

Figure 2:
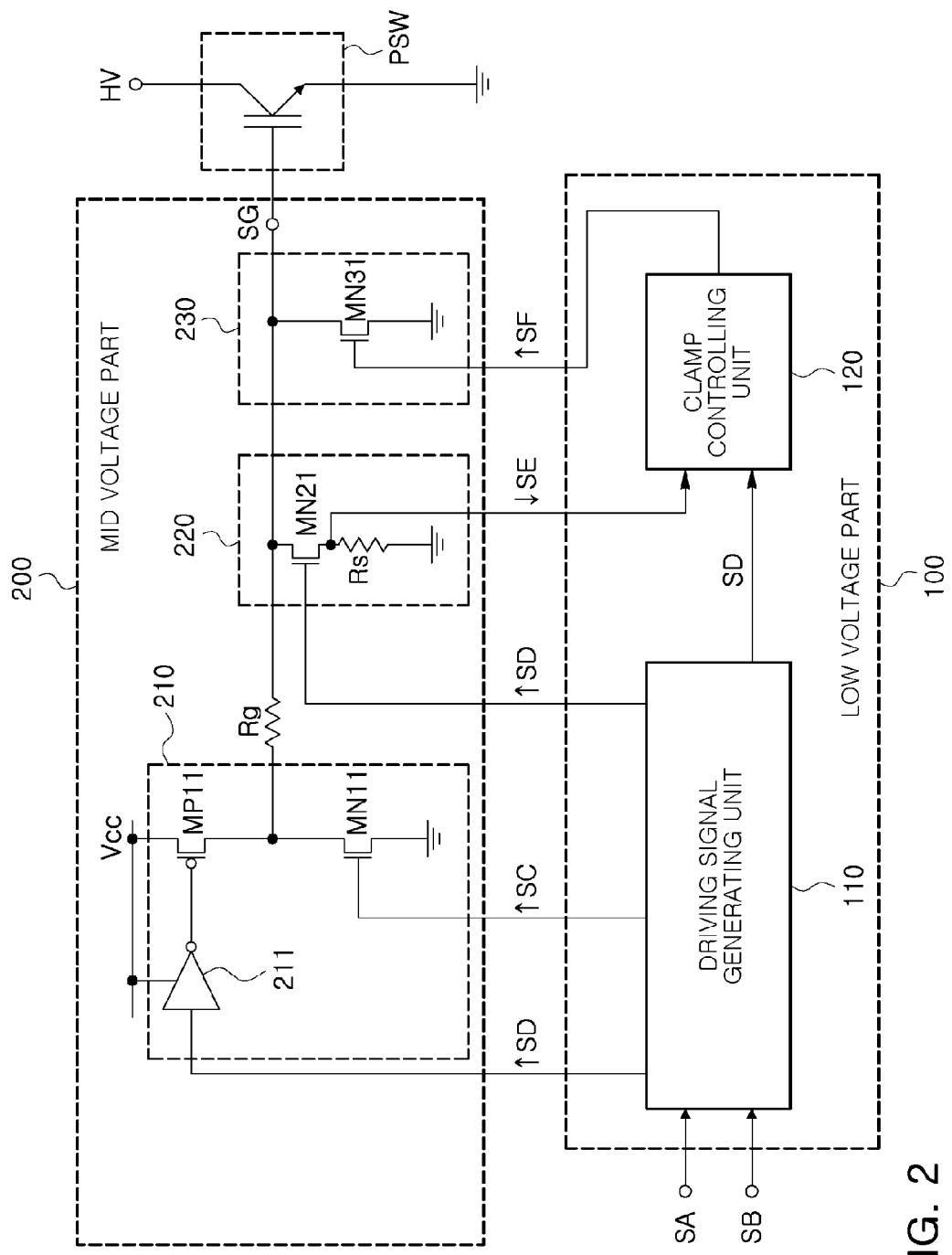
FIG. 2 is a diagram illustrating a second implementation of a gate driver circuit according to an exemplary embodiment of the present disclosure.

FIG. 2 is a diagram illustrating a second implementation of a gate driver circuit according to an exemplary embodiment of the present disclosure.

Referring to FIG. 2, the gate driver circuit according to an exemplary embodiment of the present disclosure may include a driving signal generating unit 110, a driving inverter 210, a soft turn-off/gate detecting unit 220, a clamp controlling unit 120, and an active clamp circuit unit 230.

In FIGS. 1 and 2, a reference numeral 100, denoting a low voltage part, may include the driving signal generating unit 110 and the clamp controlling unit 120. A reference numeral 200, denoting a medium voltage part, may include the driving inverter 210, the soft turn-off/gate detecting unit 220, and the active clamp circuit unit 230. In this case, according to an exemplary embodiment of the present disclosure, for example, the low voltage may be a voltage of 6V or less and the medium voltage may be a voltage within a range of 6V to 20V, but the present disclosure is not limited thereto.

The driving signal generating unit 110 may generate first and second control signals SC and SD based on a data signal SA and a fault state signal SB and may control gate detection.

Here, the data signal SA may be ON and OFF data input from the outside to control a power switch element PSW (see FIG. 4) and may include a high level and a low level to turn on and off the power switch element PSW, where the low level may be a zero level and the high level may be 0.5V or more to less than 6V. Here, according to an exemplary embodiment of the present disclosure, the high level in a low voltage part is set to be 5V, but the present disclosure is not limited thereto.

Figure 4:
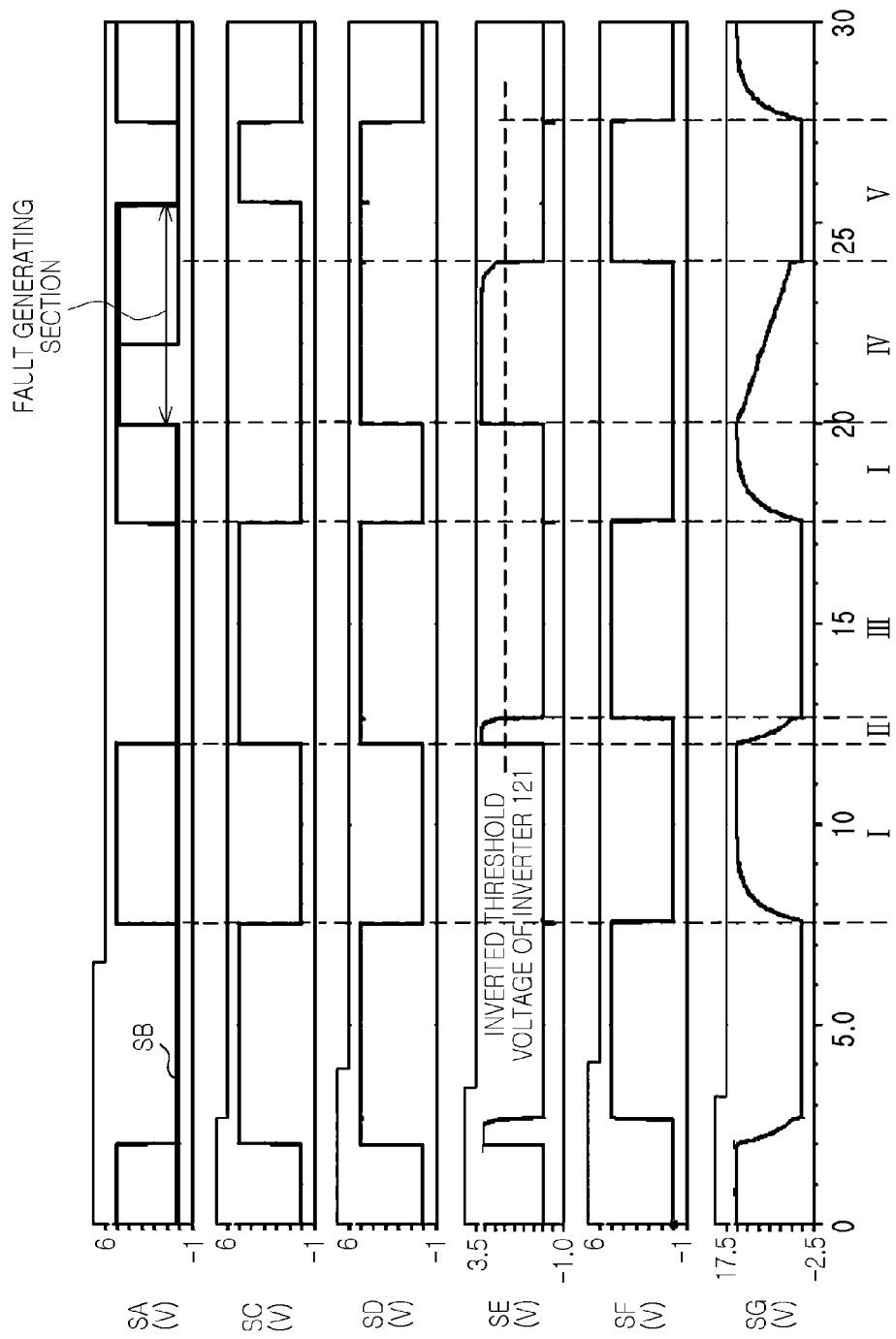
FIG. 4 is a timing chart of main signals according to an exemplary embodiment of the present disclosure.

The fault state signal SB may be the low level signal in a state before a fault is generated and may be the high level signal after the fault is generated (see FIG. 4). In addition, the first and second control signals SC and SD will be described below.

The driving inverter 210 may operate in response to the first and second control signals SC and SD to generate and provide the gate signal SG to the power switch element PSW.

For example, the gate signal SG may include a high level and a low level for turning the power switch element PSW on and off, where the high level may be the same level as an operating voltage Vcc, for example, 20V, and the low level may be zero.

The soft turn-off/gate detecting unit 220 may operate in response to the second control signal SD to thereby perform the soft turn-off in the case of a fault and may detect the gate signal SG to provide a detected signal SE.

In this case, the gate signal SG may be a voltage of a range of 6V to 20V, the high level of a medium voltage part, and the detected signal SE may be a voltage of 6V or less, the high level of a low voltage part. For example, in the case the operating voltage Vcc is 17V, the high level of the medium voltage part, the high level of the gate signal SG may be 17V and the detected signal SE may be 5V, the high level of the low voltage part.

In addition, among operations of the driving signal generating unit 110, the driving inverter 210, and the soft turn-off/gate detecting unit 220, shown in FIG. 2, a description of the same operations as those described with reference to FIG. 1 will be omitted.

The clamp controlling unit 120 may provide a gate clamp control signal SF based on the second control signal SD and the detected signal SE.

For example, in the case in which the fault is not generated and the gate signal is at the high level based on the second control signal SD and the detected signal SE, the clamp controlling unit 120 may provide a gate clamp control signal SF of a low level. Unlike this, in the case in which the fault is generated and the gate signal is at the low level, based on the second control signal SD and the detected signal SE, the clamp controlling unit 120 may provide a gate clamp control signal SF having a high level.

The active clamp circuit unit 230 may operate in response to the clamp control signal SF of the clamp controlling unit 120 to connect a gate of the power switch element PSW to a ground.

For example, in the case in which the clamp control signal SF is at the low level, the active clamp circuit unit 230 may separate the gate of the power switch element PSW and the ground from each other. In this case, the power switch element PSW may be turned on in response to the gate signal SG. Unlike this, in the case in which the clamp control signal SF is at the high level, the active clamp circuit unit 230 may connect the gate of the power switch element PSW and the ground to each other. In this case, the active clamp circuit unit 230 may clamp a gate voltage of the power switch element PSW to prevent a voltage of the power switch element PSW from being increased due to a parasitic capacitance between a collector and a gate.

As described above, in the gate driver circuit according to an exemplary embodiment of the present disclosure, since the driving signal generating unit 110 and the clamp controlling unit 120 may be included in the low voltage part, it may be implemented as a logic circuit so as to operate at a voltage of 6V or less.

Meanwhile, the driving signal generating unit 110 may generate a first control signal SC using the data signal SA and the fault state signal SB and may generate a second control signal SC using the first control signal SC and the fault state signal SB. A description thereof will be described with reference to FIG. 3.

Figure 3:
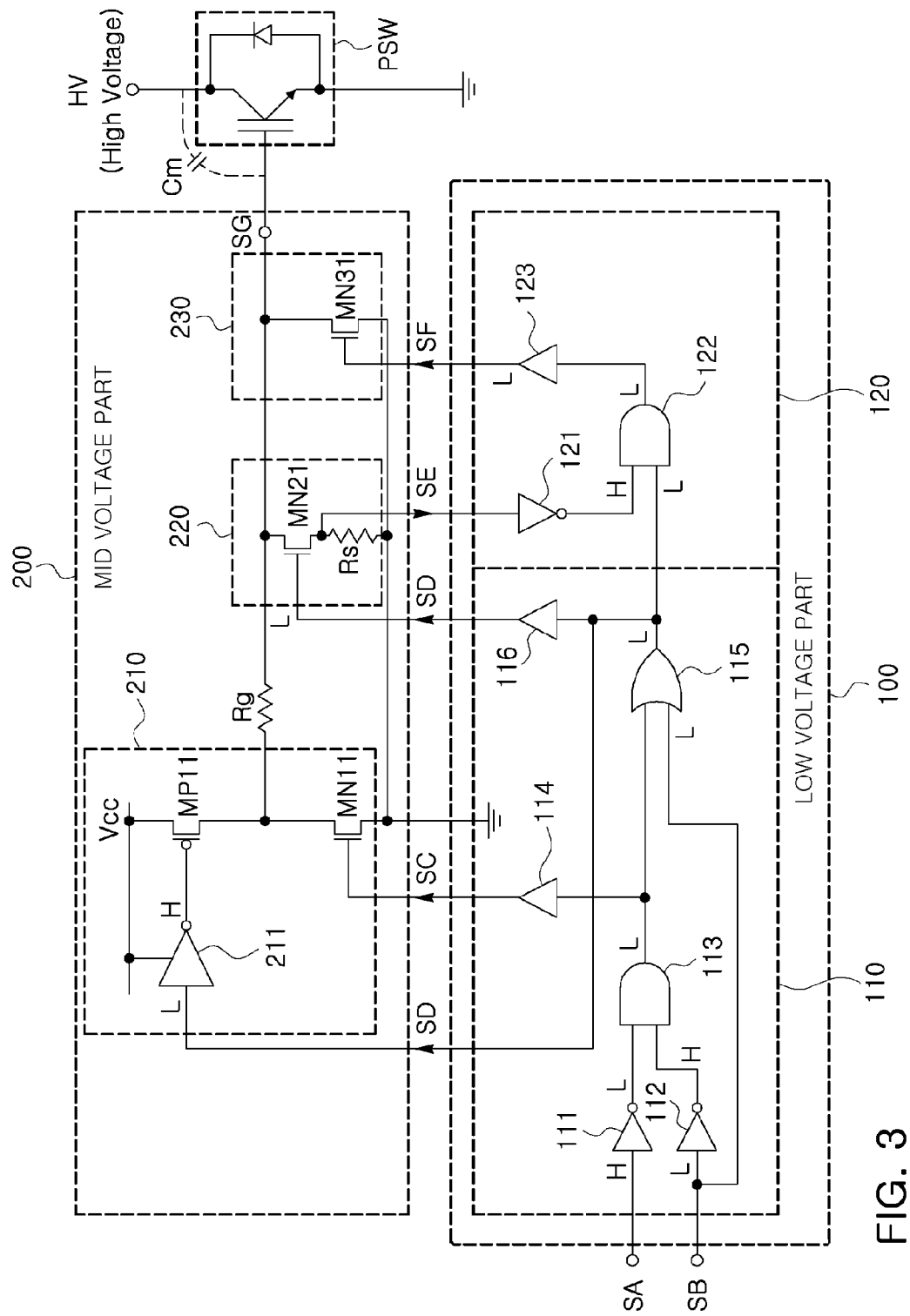
FIG. 3 is a diagram illustrating an implementation circuit of a gate driver circuit according to an exemplary embodiment of the present disclosure.

FIG. 3 is a diagram illustrating an implementation circuit of a gate driver circuit according to an exemplary embodiment of the present disclosure.

Referring to FIG. 3, the driving signal generating unit 110 may include a first inverter 111, a second inverter 112, an AND gate 113, a first buffer 114, an OR gate 115, and a second buffer 116.

The first inverter 111 may invert and provide the data signal SA and the second inverter 112 may invert and provide the fault state signal SB.

The AND gate 113 may perform an AND operation on an output signal of the first inverter 111 and an output signal of the second inverter 112 to provide the first control signal SC.

For example, in a state in which the fault is not generated, since the fault state signal SB is at the low level, and the high level, in which the fault state signal SB is inverted is one input of the AND gate 113, the first control signal SC, an output of the AND gate 113 may be synchronized with an inverted level of the data signal SA. Unlike this, in a state in which the fault is generated, since the fault state signal SB is at the high level, and the low level, in which the fault state signal SB is inverted is one input of the AND gate 113, the first control signal SC, an output of the AND gate 113 may be at the low level, regardless of the data signal SA (see FIG. 4).

In addition, the first buffer 114 may provide the first control signal SC to the driving inverter 210, and the OR gate 115 may perform an OR operation on the first control signal SC and the fault state signal SB to provide the second control signal SD.

For example, in a state in which the fault is not generated, since the fault state signal SB, at the low level is one input of the OR gate 115, the second control signal SD, an output of the OR gate 115 may be synchronized with the inverted level of the data signal SA. Unlike this, in a state in which the fault is generated, since the fault state signal SB, at the high level, is one input of the AND gate 113, the second control signal SD, an output of the OR gate 115, may have the high level, regardless of the data signal SA (see FIG. 4).

In this case, the second buffer 116 may provide the second control signal SD to the soft turn-off/gate detecting unit 220.

In addition, the driving inverter 210 may include a level shifter 211, a PMOS transistor MP11, and an NMOS transistor MN11.

The level shifter 211 may invert and shift the level of the second control signal SD. For example, in the case in which the operating voltage Vcc is 20V, the level shifter 211 may level-shift the second control signal SD having the low level (e.g., 0V) and the high level (e.g., 1V) to a signal having the high level (e.g., 17V) and the low level (e.g., 16V).

The PMOS transistor MP11 may have a source connected to the operating voltage Vcc terminal, a gate connected to an output terminal of the level shifter 211, and a drain. In this case, the PMOS transistor MP11 may be turned on and off by a signal from the level shifter 211.

In addition, the NMOS transistor NM11 may have a drain connected to the drain of the PMOS transistor MP11, a gate receiving the first control signal SC, and a source connected to a ground. In this case, the NMOS transistor NM11 may be turned on and off complementary to the turn-off and turn-on operations of the PMOS transistor MP11 in response to the first control signal SC.

Depending on the switching operation of the PMOS transistor MP11 and the NMOS transistor NM11 as described above, the gate signal SG may be provided to the power switch element PSW via a resistor Rg from a connection node between the PMOS transistor MP11 and the NMOS transistor MN11.

Here, as illustrated in FIG. 4, the gate signal SG is a signal synchronized with the data signal SA to have the high level of 17V and the low level of 0V. Therefrom, it may be appreciated that the first control signal SC is inverted and level-shifted.

The soft turn-off/gate detecting unit 220 may include an NMOS transistor MN21MN21 and a detecting resistor RS.

The NMOS transistor MN21 may have a drain connected to the gate of the power switch element PSW, a gate receiving the second control signal SD, and a source. In this case, the NMOS transistor MN21 may be switched on and off in response to the second control signal SD.

The detecting resistor RS is connected between the source of the NMOS transistor MN21 and the ground. When the NMOS transistor MN21 is turned on, a current flows from the gate of the power switch element PSW to the ground through the detecting resistor RS. In this case, the detecting resistor RS may proportionally detect the gate voltage of the power switch element PSW and may provide the detected signal SE.

The clamp controlling unit 120 may include an inverter 121, an AND gate 122, and a buffer 123.

The inverter 121 may invert the detected signal and provide it to the AND gate 122. The AND gate 122 may perform an AND operation on the second control signal and an output signal of the inverter 121 and provide it to the buffer 123. In this case, the buffer 123 may provide the output signal of the AND gate 122 to the active clamp circuit unit 230 as the clamp control signal.

The active clamp circuit unit 230 may include an NMOS transistor MN31 having a drain connected to the gate of the power switch element PSW, a gate receiving the clamp control signal SF, and a source connected to the ground.

The NMOS transistor MN31 may be operated in an ON state or an OFF state in response to the clamp control signal SF, and in a case of the ON state, may connect the gate of the power switch element PSW to the ground.

FIG. 4 is a timing chart of main signals according to an exemplary embodiment of the present disclosure.

Referring to FIGS. 3 and 4, for example, the data signal SA may be a signal in which the high level and the low level are repeated, and the fault state signal SB may be a signal having the low level in a normal state and having the high level in the case of a fault generation.

In this case, the first control signal SC may have a level into which the data signal SA is inverted in the case in which the fault state signal SB is at the low level, and may have a level into which the fault state signal SB is inverted regardless of the level of the data signal SA in the case in which the fault state signal SB is at the high level.

The second control signal SD may have the same level as the first control signal SC in the case in which the fault state signal SB is at the low level, and may have a level of the fault state signal SB regardless of the level of the first control signal SC in the case in which the fault state signal SB is at the high level.

The detected signal SE may have the high level at a point of time at which the first control signal SC is transitioned from the low level to the high level, and may have the high level for a predetermined time even in the case in which the fault state signal SB is at the high level.

The gate clamp control signal SF may have the high level when the second control signal SD is at the high level and the detected signal SE is at the low level.

In addition, it may be appreciated that the gate signal SG is synchronized in response to the data signal to have the high level and the low level, is rapidly transitioned to the low level when the detected signal SE is at the high level, and is slowly transitioned to the low level when the fault state signal SB is at the high level.

Figure 5:
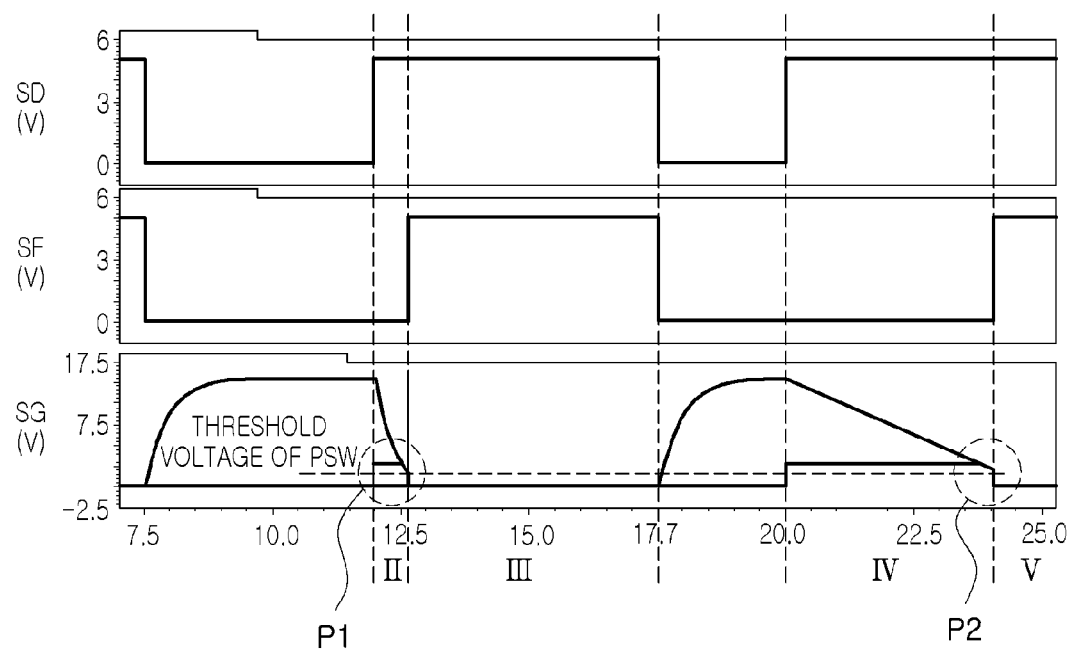
FIG. 5 is a timing chart of parts of the main signals of FIG. 4.

FIG. 5 is a timing chart of parts of the main signals of FIG. 4.

Referring to FIGS. 4 and 5, it may be appreciated with reference to a first region P1 and a second region P2 that the low level of the gate signal SG is rapidly transitioned to a ground level at a point of time at which the low level of the gate signal SG becomes equal to a threshold voltage of the power switch element PSW in the regions P1 and P2 in which the gate signal SG is transitioned to the low level.

Referring to FIGS. 1 through 5, in a section of a region I, when the data signal SA is at the high level, the level shifter 211 is inverted and level-shifted and the PMOS transistor MP11 is turned on, such that the gate signal is at high level and the power switch element PSW is turned on.

In this case, all of the NMOS transistor MN11, the NMOS transistor MN21, and the NMOS transistor MN31 are in the off-state. When the gate signal is raised from a low level (0V) to a high level (Vcc; 17V), a current, for example, from the operating voltage Vcc, flows through the PMOS transistor MP11 and a resistor Rg to charge a capacitor corresponding to the gate of the power switch element PSW and subsequently turn the power switch element PSW on. In this case, a rising time may be controlled by the PMOS transistor MP11 and the resistor Rg.

Next, in a section of a region II, when the data signal SA is at low level, the first and second control signals SC and SD become the high level and are provided to the gates of the NMOS transistor MN11 and the NMOS transistor MN21 through the first buffer 114 and the second buffer 116, such that the NMOS transistor MN11 and the NMOS transistor MN21, respectively are turned on and the gate signal SG is transitioned from the high level to the low level. In this case, the PMOS transistor MP11 is in the off-state.

Next, in a section of a region III, when the second control signal SD is at the high level, in the case in which the NMOS transistor MN21 is turned on, the gate clamp control signal SF is at high level at a value in which the detected signal SE detected from the detecting resistor RS crosses the threshold voltage of the inverter 121, such that the NMOS transistor MN31 is turned on and enhances a pull down of the gate of the power switch element PSW, thereby performing a miller clamp function.

In the region II, a pull down current flows simultaneously with the turning on voltage of the NMOS transistor MN21 and this current increases the detected voltage of the detecting resistor RS, where as the gate voltage of the power switch element PSW is pulled down, an emitter voltage of the power switch element PSW is again decreased and crosses the threshold voltage of the inverter 121, such that the output voltage of the inverter 121 is transitioned from the low level to the high level.

In a section of a region IV, in the case in which the fault is generated, the soft turn-off is performed in response to the fault state signal SB. For example, when the fault state signal SB is at high level, since the second control signal SD is at high level and is provided to the gate of the NMOS transistor MN21 through the buffer 116, the NMOS transistor MN21 is turned on. In this case, it may be appreciated that the gate voltage of the power switch element PSW gradually falls to the low level and a falling time of the gate voltage is longer than a falling time by the low level of the data signal SA in the section of the region II.

In a section of a region V, like the region III, the gate, which performs the soft turn off, turns on the NMOS transistor MN31 at a point crossing the threshold voltage of the inverter 121, thereby perform the miller clamp function.

As set forth above, according to exemplary embodiments of the present disclosure, the soft turn-off function and the gate clamping function may be performed by generating the driving signal and stably detecting the high gate signal based on the fault state.

While exemplary embodiments have been shown and described above, it will be apparent to those skilled in the art that modifications and variations could be made without departing from the spirit and scope of the present disclosure as defined by the appended claims.

What is claimed is:
1. A gate driver circuit, comprising:
a driving signal generating unit configured to generate first and second control signals based on a data signal and a fault state signal and control gate detection;
a driving inverter configured to operate in response to the first and second control signals to generate a gate signal and provide the gate signal to a power switch element; and
a soft turn-off/gate detecting unit configured to operate in response to the second control signal, perform a soft turn-off in the case of a fault, and detect the gate signal to provide a detected signal;
wherein the first control signal has a level into which the data signal is inverted when the fault state signal is at the low level and has a level into which the fault state signal is inverted regardless of a level of the data signal when the fault state signal is at the high level,
wherein the second control signal has a same level as the first control signal when the fault state signal is at the low level and has a level of the fault state signal regardless of the level of the first control signal when the fault state signal is at the high level.

2. The gate driver circuit of claim 1, wherein the driving signal generating unit generates the first control signal using the data signal and the fault state signal and generates the second control signal using the first control signal and the fault state signal.

3. The gate driver circuit of claim 1, wherein the driving signal generating unit includes:
a first inverter inverting the data signal;
a second inverter inverting the fault state signal;
an AND gate performing an AND operation on an output signal of the first inverter and an output signal of the second inverter to provide the first control signal;
a first buffer providing the first control signal to the driving inverter;
an OR gate performing an OR operation on the first control signal and the fault state signal to provide the second control signal; and
a second buffer providing the second control signal to the soft turn-off/gate detecting unit.

4. The gate driver circuit of claim 1, wherein the driving inverter includes:
a level shifter shifting a level of the second control signal;
a PMOS transistor having a source connected to an operating voltage terminal, a gate connected to an output terminal of the level shifter, and a drain; and
an NMOS transistor having a drain connected to the drain of the PMOS transistor, a gate receiving the first control signal, and a source connected to a ground,
wherein the gate signal is provided from a connection node between the PMOS transistor and the NMOS transistor via a resistor.

5. The gate driver circuit of claim 1, wherein the soft turn-off/gate detecting unit includes:
an NMOS transistor having a drain connected to a gate of the power switch element, a gate receiving the second control signal, and a source; and
a detecting resistor connected between the source of the NMOS transistor and a ground and proportionally detecting a gate voltage of the power switch element to provide the detected signal.

6. A gate driver circuit, comprising:
a driving signal generating unit configured to generate first and second control signals based on a data signal and a fault state signal and control gate detection;
a driving inverter configured to operate in response to the first and second control signals to generate a gate signal and provide the gate signal to a power switch element;
a soft turn-off/gate detecting unit configured to operate in response to the second control signal, perform a soft turn-off in the case of a fault, and detect the gate signal to provide a detected signal;

a clamp controlling unit configured to provide a gate clamp control signal based on the second control signal and the detected signal; and an active clamp circuit unit configured to operate in response to the clamp control signal of the clamp controlling unit to connect a gate of the power switch element to a ground;

wherein the first control signal has a level into which the data signal is inverted when the fault state signal is at the low level and has a level into which the fault state signal is inverted regardless of a level of the data signal when the fault state signal is at the high level, wherein the second control signal has a same level as the first control signal when the fault state signal is at the low level and has a level of the fault state signal regardless of the level of the first control signal when the fault state signal is at the high level.

7. The gate driver circuit of claim 6, wherein the driving signal generating unit generates the first control signal using the data signal and the fault state signal and generates the second control signal using the first control signal and the fault state signal.

8. The gate driver circuit of claim 6, wherein the driving signal generating unit includes:
a first inverter inverting the data signal;
a second inverter inverting the fault state signal;
an AND gate performing an AND operation on an output signal of the first inverter and an output signal of the second inverter to provide the first control signal;
a first buffer providing the first control signal to the driving inverter;
an OR gate performing an OR operation on the first control signal and the fault state signal to provide the second control signal; and
a second buffer providing the second control signal to the soft turn-off/gate detecting unit.

9. The gate driver circuit of claim 6, wherein the driving inverter includes:
a level shifter shifting a level of the second control signal;
a PMOS transistor having a source connected to an operating voltage terminal, a gate connected to an output terminal of the level shifter, and a drain; and
an NMOS transistor having a drain connected to the drain of the PMOS transistor, a gate receiving the first control signal, and a source connected to a ground,
wherein the gate signal is provided from a connection node between the PMOS transistor and the NMOS transistor via a resistor.

10. The gate driver circuit of claim 6, wherein the soft turn-off/gate detecting unit includes:
an NMOS transistor having a drain connected to the gate of the power switch element, a gate receiving the second control signal, and a source; and
a detecting resistor connected between the source of the NMOS transistor and a ground and proportionally detecting a gate voltage of the power switch element to provide the detected signal.

11. The gate driver circuit of claim 6, wherein the clamp controlling unit includes:
an inverter inverting the detected signal;
an AND gate performing an AND operation on the second control signal and an output signal of the inverter; and
a buffer providing an output signal of the AND gate to the active clamp circuit unit as the clamp control signal.

12. The gate driver circuit of claim 6, wherein the active clamp circuit unit includes an NMOS transistor having a drain connected to the gate of the power switch element, a gate receiving the clamp control signal, and a source connected to the ground.

13. A gate driver circuit, comprising:
a driving signal generating unit configured to generate first and second control signals based on a data signal and a fault state signal and control gate detection;
a driving inverter configured to operate in response to the first and second control signals to generate a gate signal and provide the gate signal to a power switch element;
a soft turn-off/gate detecting unit configured to operate in response to the second control signal, perform a soft turn-off in the case of a fault, and detect the gate signal to provide a detected signal;
a clamp controlling unit configured to provide a gate clamp control signal based on the second control signal and the detected signal; and
an active clamp circuit unit configured to operate in response to the clamp control signal of the clamp controlling unit to connect a gate of the power switch element to a ground, wherein the driving signal generating unit and the clamp controlling unit are implemented as a logical circuit;

wherein the first control signal has a level into which the data signal is inverted when the fault state signal is at the low level and has a level into which the fault state signal is inverted regardless of a level of the data signal when the fault state signal is at the high level, wherein the second control signal has a same level as the first control signal when the fault state signal is at the low level and has a level of the fault state signal regardless of the level of the first control signal when the fault state signal is at the high level.

14. The gate driver circuit of claim 13, wherein the driving signal generating unit generates the first control signal using the data signal and the fault state signal and generates the second control signal using the first control signal and the fault state signal.

15. The gate driver circuit of claim 13, wherein the driving signal generating unit includes:
a first inverter inverting the data signal;
a second inverter inverting the fault state signal;
an AND gate performing an AND operation on an output signal of the first inverter and an output signal of the second inverter to provide the first control signal;
a first buffer providing the first control signal to the driving inverter;
an OR gate performing an OR operation on the first control signal and the fault state signal to provide the second control signal; and
a second buffer providing the second control signal to the soft turn-off/gate detecting unit.

16. The gate driver circuit of claim 13, wherein the driving inverter includes:
a level shifter shifting a level of the second control signal;
a PMOS transistor having a source connected to an operating voltage terminal, a gate connected to an output terminal of the level shifter, and a drain; and
an NMOS transistor having a drain connected to the drain of the PMOS transistor, a gate receiving the first control signal, and a source connected to a ground,
wherein the gate signal is provided from a connection node between the PMOS transistor and the NMOS transistor via a resistor.

17. The gate driver circuit of claim 13, wherein the soft turn-off/gate detecting unit includes:

an NMOS transistor having a drain connected to the gate of the power switch element, a gate receiving the second control signal, and a source; and a detecting resistor connected between the source of the NMOS transistor and a ground and proportionally detecting a gate voltage of the power switch element to provide the detected signal.

18. The gate driver circuit of claim 15, wherein the clamp controlling unit includes:

an inverter inverting the detected signal;

an AND gate performing an AND operation on the second control signal and an output signal of the inverter; and a buffer providing an output signal of the AND gate to the active clamp circuit unit as the clamp control signal.

19. The gate driver circuit of claim 15, wherein the active clamp circuit unit includes an NMOS transistor having a drain connected to the gate of the power switch element, a gate receiving the clamp control signal, and a source connected to the ground.

\* \* \* \* \*